(12) United States Patent
Ferree

(10) Patent No.: US 11,715,921 B2
(45) Date of Patent: Aug. 1, 2023

(54) QUICK METER CONNECT ELECTRIC AUTOMOBILE CHARGING SYSTEM

(71) Applicant: Kevin John Ferree, La Mesa, CA (US)

(72) Inventor: Kevin John Ferree, La Mesa, CA (US)

( * ) Notice: Subject to any disclaimer, the term of this patent is extended or adjusted under 35 U.S.C. 154(b) by 0 days.

(21) Appl. No.: 17/216,612

(22) Filed: Mar. 29, 2021

(65) Prior Publication Data

US 2022/0311197 A1 Sep. 29, 2022

(51) Int. Cl.
*H01R 33/945* (2006.01)
*H01R 31/06* (2006.01)
*B60L 53/60* (2019.01)
*B60L 53/16* (2019.01)
*G01R 22/06* (2006.01)
*H01R 13/713* (2006.01)

(52) U.S. Cl.
CPC ............ *H01R 31/065* (2013.01); *B60L 53/16* (2019.02); *B60L 53/60* (2019.02); *G01R 22/065* (2013.01); *H01R 13/7135* (2013.01); *H01R 2201/20* (2013.01); *H01R 2201/26* (2013.01)

(58) Field of Classification Search
CPC .............. H01R 13/7135; H01R 31/065; H01R 2201/20; H01R 2201/26; B60L 53/60; B60L 53/16; G01R 22/065
USPC ........................................................ 439/517
See application file for complete search history.

(56) References Cited

U.S. PATENT DOCUMENTS

| | | | | |
|---|---|---|---|---|
| 3,957,118 A * | 5/1976 | Barry | ...................... | E21B 23/14 439/372 |
| 4,416,494 A * | 11/1983 | Watkins | ................ | E21B 17/003 175/45 |
| 5,588,874 A * | 12/1996 | Pruehs | ...................... | H02B 1/03 439/146 |
| 6,059,605 A * | 5/2000 | Robinson | ............. | H01R 9/2491 439/146 |
| 6,188,145 B1 * | 2/2001 | Stewart | ...................... | H02J 3/38 307/64 |
| 6,325,666 B1 * | 12/2001 | Robinson | ............... | H01R 33/97 439/517 |
| 6,737,855 B2 * | 5/2004 | Huber | .................. | G01R 22/065 73/431 |
| 6,798,191 B1 * | 9/2004 | Macfarlane | ............ | H05K 1/116 324/156 |

(Continued)

FOREIGN PATENT DOCUMENTS

WO WO-2017046116 A1 * 3/2017 ............... G01R 1/20

*Primary Examiner* — Abdullah A Riyami
*Assistant Examiner* — Vladimir Imas
(74) *Attorney, Agent, or Firm* — Jonathan Kidney; Intelink Law Group, P.C.

(57) ABSTRACT

An electrical meter quick connect device has a housing with open faces. A first face is configured with connectors to mate to a electrical service panel in a meter connection manner, and a second face is configured with connectors to mate to a meter in an electrical service panel connection manner. First and second set of lines are within the housing, connected from the first face to the second face. A breaker switch is on the housing and coupled to at least one of the first and second set of lines. A third set of lines is connected to the breaker switch and exits a side of the housing, the third set including a ground line. An electrical vehicle charging line is coupled to the third set of lines. The device can be inserted between a meter and electrical service panel to provide an electric vehicle power connection.

15 Claims, 4 Drawing Sheets

(56) References Cited

U.S. PATENT DOCUMENTS

| | | | | |
|---|---|---|---|---|
| 6,825,776 B2* | 11/2004 | Lightbody | ............... | H04Q 9/02 |
| | | | | 340/870.02 |
| 6,846,199 B1* | 1/2005 | Robinson | ............... | G01R 11/04 |
| | | | | 361/663 |
| 7,030,514 B2* | 4/2006 | Wareham | ................ | H02J 9/066 |
| | | | | 307/64 |
| 7,158,050 B2* | 1/2007 | Lightbody | ............ | G01R 22/065 |
| | | | | 702/57 |
| 7,648,389 B1* | 1/2010 | Scott | .................... | H01R 9/2491 |
| | | | | 439/517 |
| 8,581,450 B2* | 11/2013 | Mathiowetz | ........... | H01R 24/28 |
| | | | | 361/671 |
| 8,784,130 B2* | 7/2014 | Scott | .................... | H01R 33/945 |
| | | | | 439/640 |
| 9,391,414 B2* | 7/2016 | Seals | ..................... | H01R 31/065 |
| 9,500,672 B1* | 11/2016 | Bautista | ................. | H01R 33/94 |
| 9,627,861 B2* | 4/2017 | Cruz | ........................ | G01R 22/065 |
| 9,728,972 B2* | 8/2017 | Cruz | ........................ | H02B 3/00 |
| 2004/0066311 A1* | 4/2004 | Giles | ........................ | H04Q 9/02 |
| | | | | 340/870.02 |
| 2011/0159725 A1* | 6/2011 | Curto | ..................... | H01R 33/94 |
| | | | | 439/517 |

* cited by examiner

QUICK METER CONNECT ELECTRIC AUTOMOBILE CHARGING SYSTEM

FIELD

This invention relates to electric vehicle charging. More particularly, it relates to a device that can be easily installed between a utility meter and utility panel to interface with an electric automobile for the purpose of charging.

BACKGROUND

With the popularity of electric vehicles, more and more owners are installing chargers in their homes, apartments, condominiums and businesses to charge their vehicles. This requires several hours of services by an electrician to rewire electrical panels, install outlets, conduits, run cables, cut and core through walls as well as attach an Electric Vehicle Charger to a wall somewhere. Typically, this effort is considered a custom job and can be several thousands of dollars, not including the cost of the charger. Further, once the home is sold, the owner usually does not wish to invest more money to remove the charger, often leaving it for the next owner who may not have an electric car. Therefore, it would be beneficial to have a standardized device that easily interfaces with the standardized electrical utility meter system and is simple to install or remove, to achieve the same end.

To that effect, various methods and systems are described below that enable the rapid quick installation of an automobile charger via an interfacing device to the "house's" metering system.

SUMMARY

The following presents a simplified summary in order to provide a basic understanding of some aspects of the claimed subject matter. This summary is not an extensive overview, and is not intended to identify key/critical elements or to delineate the scope of the claimed subject matter. Its purpose is to present some concepts in a simplified form as a prelude to the more detailed description that is presented later.

In one aspect of the disclosed embodiments, an electrical meter quick connect device is provided, comprising: an environmental housing with opposing open faces, a first face is configured with connectors to mate directly to a electrical service panel in a meter connection manner, and a second face is configured with connectors to mate directly to a meter in an electrical service panel connection manner; a first and second set of lines, within the housing, connect from the first face to the second face, a breaker switch is disposed on the housing and coupled to at least one of the first and second set of lines; a third set of lines connected to the breaker switch and exiting a side of the housing providing power output, the third set including a ground line; and an electrical vehicle charging line coupled to the third set of lines, wherein the quick connect device can be inserted between a meter and electrical service panel to provide an electric power connection for an electrical vehicle.

In another aspect of the disclosed embodiments, the above device is provided, wherein the housing is cylindrical; and/or wherein the breaker is connected in parallel to the at least one of the first and second set of lines; and/or wherein the breaker is connected in series to that at least one of the first and second set of lines; and/or wherein the electrical vehicle charging line is removably coupled to the third set of lines; and/or further comprising a meter attached to the second face and the device's first face attached to an electrical service panel; and/or further comprising at least one securing ring, securing the device to the meter; and/or further comprising at least one of a timer and clock, coupled to the power output; and/or further comprising a wireless transmitter, externally providing logging information; and/or further comprising a second meter for logging electricity usage in the third set of lines; and/or wherein a securing position of the housing is variable, permitting the breaker and electrical vehicle charging line to be rotated to a desired angle; and/or wherein single or 3-phase power is provided to the charging line; and/or wherein 120V, 240V, 208V, 277V, or 480V is provided to the charging line; and/or further comprising an electric vehicle connected to the charging line; and/or wherein the electrical vehicle is operating as a power source and the charging line provides power to the electrical service panel.

DETAILED DESCRIPTION

Figure 1:
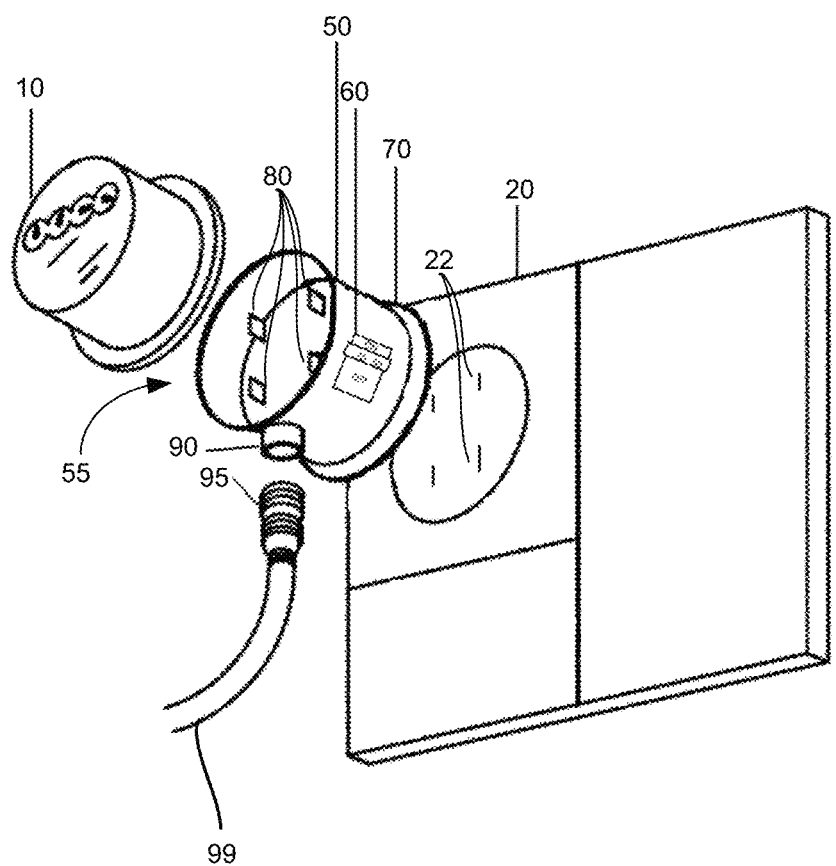
FIG. 1 is an exploded view of an exemplary Quick Meter Connect (QMC) device.

FIG. 1 is an exploded view illustration 100 of an exemplary Quick Meter Connect (QMC) device 55 for connection between an electric service utility meter 10 and electric panel/load center 20. Aspects of a utility meter 10 and electric panel 20 are well known in the art and therefore not further detailed herein, understanding that both the meter 10 and panel 20 contain contact elements, prongs, or receptacles (shown here for the panel 20 as elements 22) that physically mate to each other and provide electrical pathways between the two. The example being shown here is for a U.S. residential set-up having both 110 & 220 VAC connections. However, a non-residential configuration or international configurations can be implemented without departing from the spirit and scope of this disclosure.

The exemplary QMC device 55 has a protective housing 50 which contains on its front side corresponding front contact elements 80 that mirror the contacts 22 of the panel 20, so as to render itself electrically transparent to the meter 10. The housing 50 may be cylindrical as shown or may be of another shape, depending on implementation preference. The elements 80 are connected internally to breaker switch 60 for Over Current Protection and Ground Fault Protection, per the National Electric Codes (NEC) or other applicable safety code; and in turn connected to the panel's elements 22. Circuit breaker 60 can be part of QMC device 50 so as to be physically attached therefore non-removable and outfitted with a current limiting amperage switch based on panel and utility rating. Or circuit breaker 60 can be a commercially known brand and be removed and installed with a current limiting amperage switch based on panel and utility rating. Circuit breaker 60 will be of weatherproof design and functionality. The rear 70 of the QMC device 55 is fitted with rear contact elements (not shown) that mate to the panel's elements 22. Mounting and the electrical connection of the QMC device 55 to the panel 20 can be achieved through typical means such as used in industry for the meter 10, or via other means. Non-limiting examples for the electrical connections can be via metal jaws, insertable slots, screw-down connectors, friction, etc. Non-limiting examples for the mechanical connections can be through bolts, screws, screw-on, brackets, friction, etc. Also, a protective sleeve (not shown) may be utilized. It is understood that some electrical connection methods also provide mechanical connection functions.

QMC device 55 further includes a charging line coupler 90 that mates to charging line connector 95 at the end of conduit or charging line 99. The method for coupling can be via threaded connection, snap-in, etc. The coupler 90 can be configured for connection to various charging line brands. Coupler 90 can be a plug-n style receptacle, for example, NEMA 14-50 with a weatherproof design. Coupler 90 may also be of a quick breakaway design to provide extra safety measures (e.g., magnetic, snap-in, etc.). It is noted here that in some embodiments, coupler 90 may be first facilitated for connection to a conduit or raceway that leads to a later-connected charging line 99, if the electric vehicle charging location is not near the meter 10 location.

In operation, as the QMC device 55 allows connections to the load side of the meter 10, any current/voltage is passed from the panel 20 into the meter 10, passing through the QMC device 55 and any current/voltage used by the charging line 99 will be registered in the meter 10. Conversely, any current/voltage sourced from the charging line 99 will be reflected in the meter 10. With appropriate interconnections, the QMC device 55 can provide any phase, voltage, single or 3-phase 120/240V, 120V/208V, 277V/480V etc. Thus, anywhere a utility meter is located, a QMC device 55 can be installed. In other applications, the QMC 55 device may also be tapped to the utility side of the meter 10, therefore not registering the electric consumption by the charging system on the meter 10.

By interfacing the QMC device 55 between the meter 10 and panel 20, using the pre-existing meter-to-panel connection setup, the QMC device 55 can be quickly and easily attached and detached, without requiring rewiring of the panel 20. Therefore, no damage to the home/business structure is required, and no additional circuit breaker space or circuit breaker is needed to be installed in the panel, the QMC device 55 and can be direct-shipped to a customer for customer-qualified installation or installation by a professional.

Figure 2:
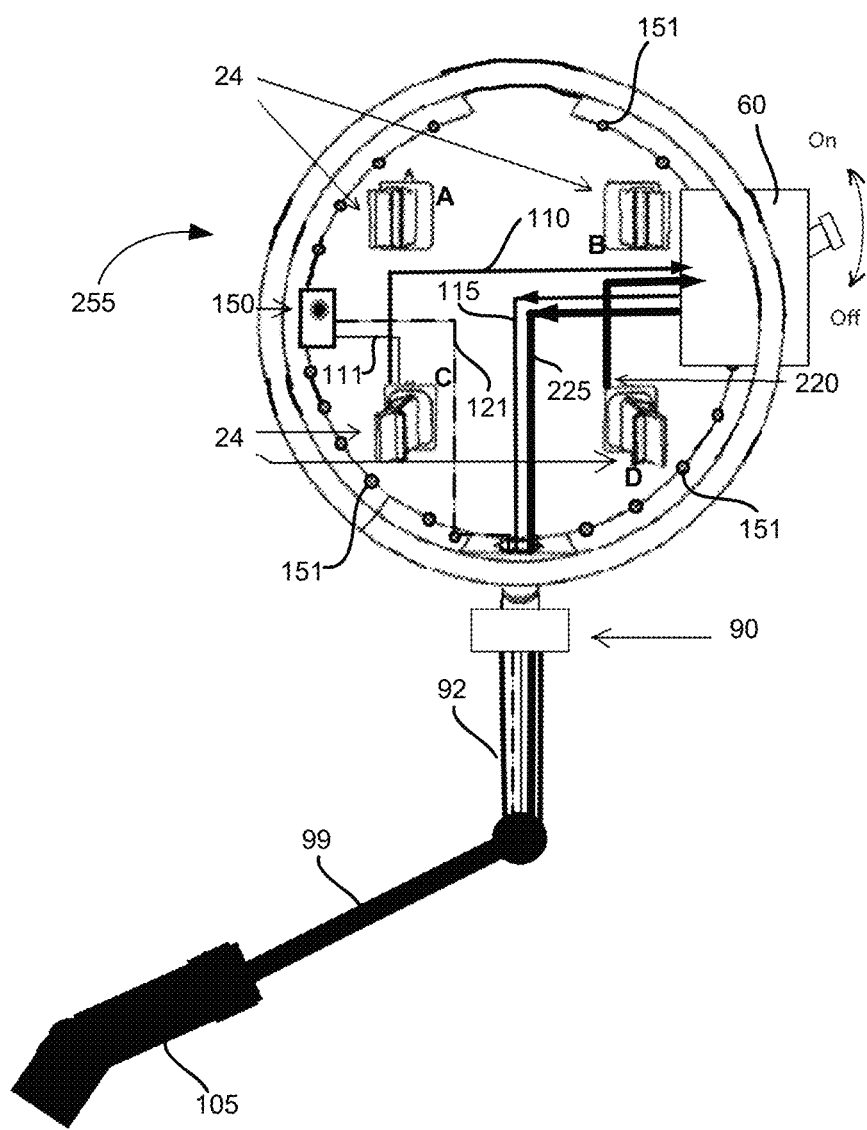
FIG. 2 is an internal wiring connection layout for an exemplary QMC device.

FIG. 2 is an internal wiring connection layout 200 for an exemplary QMC device 255. contact elements 24 (mirroring elements 80 in FIG. 2) are labeled as contacts A, B, (representing the utility side) C, and D (representing the metered side), which both connect to the supply panel load center (not shown) and represent the respective electrical voltages/currents taps. In this example, contact C and can provide 120V and is fed via line 110 into breaker 60. Output of the 120V from the breaker 60 is indicated by line 115 which leads into the coupler 90 into charging line 99. Similarly, for 240V, contact D's 120V is tapped and fed via line 220 into the breaker 60, joined with line 110 to add up to 240V and routed via line 115 to the charging line 99.

In this example, it is understood that any electricity tapped by a charger through contacts C & D would be reflected in the meter (not shown). Also, any electricity tapped by a charger through contacts A & B would not be metered. Contacts A & B are unused in this example, but may be also tapped according to the desired voltage/current output desired. Thus, multiple voltages can be provided to the charging line 99. Note: contacts A & B would not determine the voltage, the voltage would be determined by incoming utility supply.

A cut-away view of an optional conduit 92 is shown between the coupler 90 and charging line 99. At the end of the charging line 99 is the appropriate charger plug for the electrical vehicle being charged. Around a circumference of the exemplary QMC device 255, A standardized commercially used utility locking ring can be used or there can be an optional locking or attachment mechanism/controller 150 which energizes one or more locking points 151 disposed about the QMC device 255. For example, a magnetic or electric triggered lock or ring can be utilized. In operation, when the exemplary QMC device 255 is energized, the attachment mechanism/controller 150's "locking" prevents unauthorized opening of the QMC device 255. This provides a safety mechanism in addition to the circuit breaker 60. Energy for the attachment controller 150 can be obtained from tapping contact C's 120V. Ground can be connected to the attachment controller 150 and fed via line 121 into the charging line 99. QMC device 255 may be constructed of metal and therefore grounded or constructed of plastic/polymer and conductor grounded through panel/load center.

In a simpler embodiment, the "locking" of the QMC device 255 can be achieved with a tightenable sleeve or via threaded connections, snap in, etc. In a prototype, the QMC device was designed with dimensions approximately 7 inches in diameter and 4.5 inches deep. Of course, as stated above, different dimensions and shapes may be used, is so desired.

Figure 3:
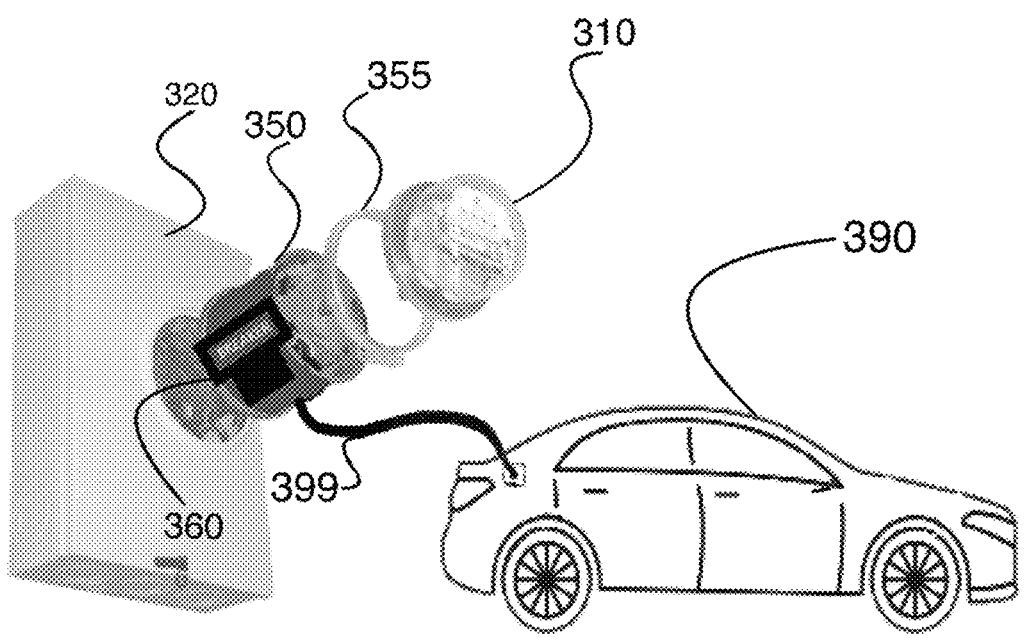
FIG. 3 is an exploded view of an exemplary QMC device connected to an electric vehicle.

FIG. 3 is an exploded view of an exemplary QMC device 350 using a screw-tightened sleeve 355 to join the meter 310. The QMC device 350 is connected to the panel 320 via breaker 360 which provides power via the QMC device 350 into charging line 399 to ultimately charge electric vehicle 390.

Figure 4A:
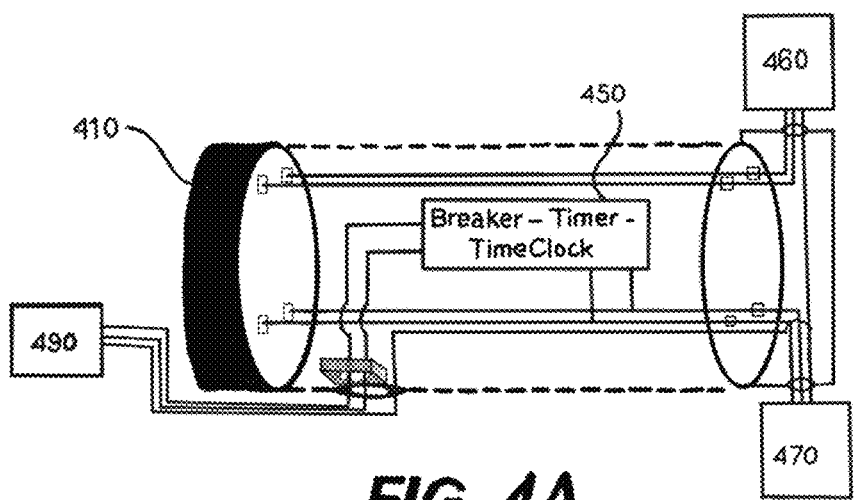
FIGS. 4A-C are block diagram illustrations of alternative exemplary embodiments.
Figure 4B:
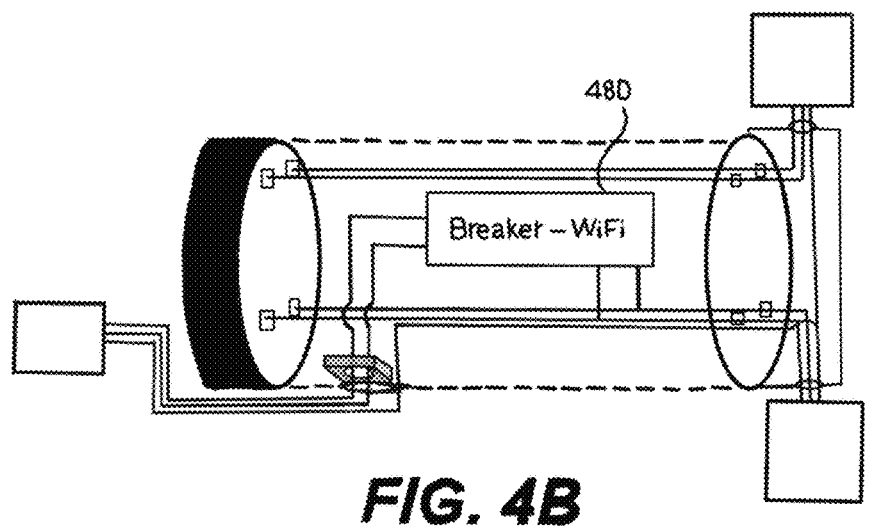
Figure 4C:
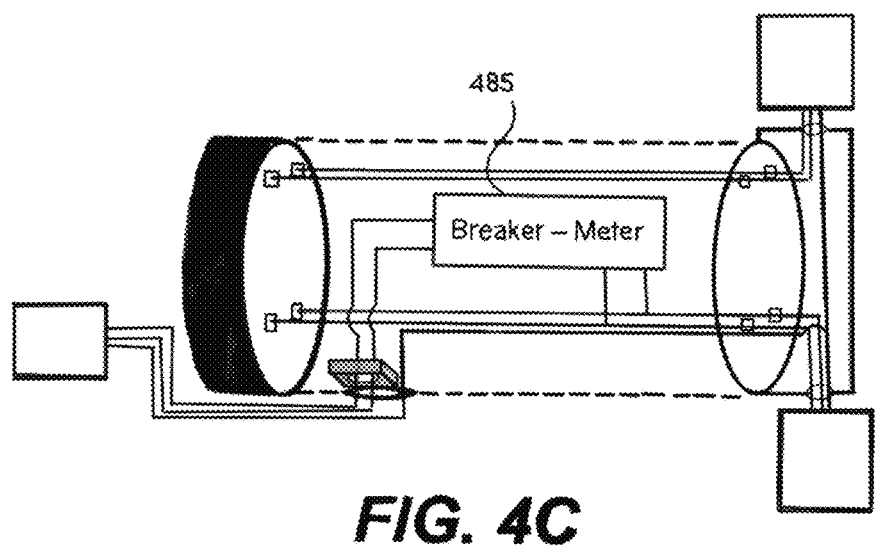

FIGS. 4A-C are block diagram illustrations of alternative exemplary embodiments. FIG. 4A is a wiring diagram displaying a Breaker-Timer-TimeClock 450 within the QMC device, so as to regulate/allow charging to electric vehicle 490 at certain times. 460 represents the electric utility supply and 470 represents the load to the electrical panel. Of course, the Timer/TimeClock portion may be separate as well as separately located from the breaker portion. FIG. 4B displays a Breaker-wireless communication capability 480 internal to the QMC device to provide separate logging of consumed charger energy. Of course, the Timer/TimeClock portion may be separate as well as separately located from the breaker portion. Alternatively, a a breaker with "analog" KWH meter combination 485 may be devised (shown here are joined to the breaker portion, but may be separate) may be affixed to the QMC device for independent charge logging.

In alternative embodiments, the exact positioning of the circuit breaker and/or charger connection may be altered, according to design preference. Further, the rotational positioning of the QMC device may be adjustable so as to allow the QMC device to be rotated clockwise or counter clockwise as to allow the coupler and circuit breaker to be in the best possible location for use.

It should be further understood that this and other arrangements described herein are for purposes of example only. As such, those skilled in the art will appreciate that other arrangements and other elements (e.g., machines, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims

What is claimed is:

1. An electrical meter quick connect device, comprising:
   an environmental cylindrical housing with opposing open faces, a first face is configured with connectors to mate directly to an electrical service panel in a meter connection manner, and a second face is configured with connectors to mate directly to a meter in an electrical service panel connection manner;
   a first and second set of lines, internal to the housing, connecting from the first face to the second face,
   a breaker switch integral to and disposed on an external side of the housing and coupled to at least one of the first and second set of lines;
   a third set of lines connected to the breaker switch and exiting the side of the housing providing power output, the third set including a ground line; and
   an electrical vehicle charging line coupled to the third set of lines,
   wherein the quick connect device can be inserted between a meter and electrical service panel to provide an electric power charging connection for an electrical vehicle.

2. The device of claim 1, wherein the housing is cylindrical.

3. The device of claim 1, wherein the breaker is connected in parallel to the at least one of the first and second set of lines.

4. The device of claim 1, wherein the breaker is connected in series to that at least one of the first and second set of lines.

5. The device of claim 1, wherein the electrical vehicle charging line is removably coupled to the third set of lines.

6. The device of claim 1, further comprising a meter attached to the second face and the device's first face attached to an electrical service panel.

7. The device of claim 6, further comprising at least one securing ring, securing the device to the meter.

8. The device of claim 1, further comprising at least one of a timer and clock, coupled to the power output.

9. The device of claim 1, further comprising a wireless transmitter, externally providing logging information.

10. The device of claim 1, further comprising a second meter for logging electricity usage in the third set of lines.

11. The device of claim 1, wherein a securing position of the housing is variable, permitting the breaker and electrical vehicle charging line to be rotated to a desired angle.

12. The device of claim 1, wherein single or 3-phase power is provided to the charging line.

13. The device of claim 1, wherein 120V, 240V, 208V, 277V, or 480V is provided to the charging line.

14. The device of claim 1, further comprising an electric vehicle connected to the charging line.

15. The device of claim 14, wherein the electrical vehicle is operating as a power source and the charging line provides power to the electrical service panel.

* * * * *